United States Patent [19]

Nakanishi et al.

[11] Patent Number: 5,284,796
[45] Date of Patent: Feb. 8, 1994

[54] PROCESS FOR FLIP CHIP CONNECTING A SEMICONDUCTOR CHIP

[75] Inventors: Teru Nakanishi; Kazuaki Karasawa; Masayuki Ochiai; Kaoru Hashimoto, all of Kawasaki, Japan

[73] Assignee: Fujitsu Limited, Kawasaki, Japan

[21] Appl. No.: 939,695

[22] Filed: Sep. 2, 1992

[30] Foreign Application Priority Data

Sep. 10, 1991 [JP] Japan ................... 3-229266

[51] Int. Cl.⁵ ............... H01L 21/283; H01L 21/58; H01L 21/60
[52] U.S. Cl. ..................... 437/183; 437/209; 437/226; 228/254; 228/180.22
[58] Field of Search ........... 437/183, 209, 226; 228/180.2, 254

[56] References Cited

FOREIGN PATENT DOCUMENTS 0147576 7/1985 European Pat. Off. .
4-22130 1/1992 Japan .
2095473 9/1982 United Kingdom .

OTHER PUBLICATIONS

Patent Abstracts of Japan, vol. 9, No. 8 (E-289) Jan. 12, 1985 & JP-A-59 155162 (Fujitsu KK) Sep. 4, 1984.
Patent Abstracts of Japan, vol. 16, No. 185 (E-1197) May 6, 1992 & JP-A-022130 (Sharp Corp) Jan. 27, 1992.

Primary Examiner—Olik Chaudhuri
Assistant Examiner—David E. Graybill
Attorney, Agent, or Firm—Staas & Halsey

[57] ABSTRACT

A process for a flip chip connection of a semiconductor chip includes the steps of forming a plurality of stud bumps on the semiconductor chip, on which a plurality of solder bumps are formed, in the vicinity of the outer periphery thereof and on the outside of the solder bumps, providing a cut groove between a plurality of the solder bumps and the stud bumps, mating the solder bumps on the semiconductor chip and the corresponding solder bumps on the circuit board and heating for subsequent integration of the mating solder bumps, and breaking way the outer peripheral portion of the semiconductor chip along the cutting groove after a flip chip connection in order to remove the stud bumps.

6 Claims, 2 Drawing Sheets

PROCESS FOR FLIP CHIP CONNECTING A SEMICONDUCTOR CHIP

BACKGROUND OF THE INVENTION

1. Field of the Invention

The present invention relates generally to a process for flip chip connecting a semiconductor chip.

2. Description of the Related Art

According to the progress of information processing technology, semiconductor devices that form the major part of information processing equipment have an ever increasing demand for greater capacity. Nowadays, LSI and VLSI have been put into practical use.

As is well known, these integrated circuit elements have a large number of unit transistors arranged in a matrix form array on a semiconductor chip in a size of several $mm^2$. When a circuit connection is effected by a wire bonding, the back side of the semiconductor chip is initially bonded on a circuit board by an eutectic alloy or solder or an adhesive. Then, a plurality of electrode terminals (pads) provided on the circumference of the chip are wire bonded with a plurality of electrode terminals (pads) provided on the circuit board for establishing electrical connection with conductors on the circuit board.

However, due to extremely high density, such wire bonding method is not applicable for a large capacity element, such as an LSI. For large capacity elements, it is typical to employ a flip chip connection method, in which solder bumps are arranged in matrix form on a surface side of the semiconductor chip. Upon being mounted on the circuit board, the surface side of the semiconductor chip is mated with the surface of the circuit board so that the solder bumps on the semiconductor chip come into contact with solder bumps on the circuit board and are soldered to each other.

Employing this method, since the semiconductor elements can be directly mounted on the circuit board, signal transmission paths can be significantly shortened. This contributes to the reduction of transmission loss of the signal transmitted through the signal transmission paths. In practice, solder bumps having configurations identical to those of the solder bumps on the semiconductor elements are formed on the circuit board, such as those made of ceramic, at positions exactly corresponding to those on the semiconductor elements. The semiconductor element is mounted on the circuit board by mating respective solder bumps thereof with the solder bumps on the circuit board. Thereafter, a heat higher than the melting point of the bumps is applied so as to melt the solder bumps for welding respectively mating bumps.

Most of the current semiconductor integrated circuits are formed of silicon (Si). On the other hand, most of the currently available circuit boards are formed of alumina ceramics or glass ceramics.

As set forth above, large capacity elements, such as LSI, VLSI and so forth are frequently mounted on the circuit board by flip chip connection.

The inventors have proposed in Japanese Patent Application No. 2-118388, which has been commonly assigned to the assignee of the present invention, a method for forming a plurality of solder bumps on the semiconductor chip or the circuit board with high positioning precision. The disclosure of the above-identified Japanese Patent Application is incorporated herein by reference.

Using the solder bumps formed by the proposed method, flip chip connections can be effected in a practical and efficient manner.

A brief discussion of the conventional method will be provided.

At first, as shown in FIG. 2, a metal mask is fitted on a transparent substrate 1 that has high thermal resistance but cannot be connected by soldering, such as a glass plate or a transparent quartz plate. At this position, solder is deposited by vacuum disposition to form solder projections 2 (FIG. 2A).

On the other hand, a substrate 3, such as a semiconductor chip or a circuit board to be processed, is preliminarily formed with pads of gold (Au) or so forth, equal in size to solder bumps formed at positions forming the solder bumps, by way of vacuum desposition or other suitable methods.

The substrate 3 to be processed is heated at a temperature higher than or equal to a melting point of the solder. The solder projections 2 on the transparent substrate 1 are then positioned and aligned with respective corresponding pads 4 arranged in matrix form, and the solder projections 2 and the pads 4 are mated with each other (FIG. 2B).

Since the solder forming the solder projections 2 have low adhering ability to the transparent substrate 1 and have high adhering ability to the pads 4, the solder projections 2 are transferred to the pads 4 to form the solder bumps 5 (FIG. 2C).

A feature of this forming method is that, even when a slight offset is present between the pads 4 on the substrate 3 to be processed and the solder projection 2 on the transparent substrate 1, the semisphere solder bumps 5 can be formed on the pads by self alignment.

Next, the solder bumps 5 thus formed on the semiconductor chip 6 are positioned in alignment with the corresponding solder bumps 5 on the circuit board 7 and then mated with the latter (FIG. 2D). By heating the circuit board 7 to a temperature higher than or equal to the melting point of the solder, the mating solder bumps 5 are molten and are welded to each other. The welded solder is cask-shaped (FIG. 2E).

However, in such a connection method, stress due to the difference in thermal expansion coefficients between the semiconductor chip 6 and the circuit board 7 can concentrate at the junction between the soldered cask form solder and the substrates and thereby lower reliability.

To avoid this problem, various methods of forming the solder mass into a configuration with an intermediate waist portion such that the diameter is reduced have been proposed.

In one of the proposed methods, a plurality of spacers are mounted on the circuit board so as to provide a clearance between the semiconductor chip and circuit board.

However, this method encounters a problem in that it is difficult to maintain sufficient space to insert the spacers because of the small area of the semiconductor chip. Also, it is difficult to maintain the height of the spacers constant. In view of the above, this method is not practical and results in low workability.

Also, there has been proposed another method, in which the semiconductor chip is drawn up after connection to form the waist portion. However, this method is not practical and it lowers the reliability of the products.

Further, Japanese Unexamined Patent Publication (Kokai) No. 4-22130 discloses a flip chip connection method in which stud bumps are formed on a semiconductor chip, on which solder bumps are formed on the periphery of the chip. However, this reference does not disclose the provision of solder bumps on the substrate on which the chip is mounted, in addition to the provision of the solder bumps on the chip. Also, this reference does not disclose the removal of the stud bumps after completion of the flip chip connection.

SUMMARY OF THE INVENTION

Therefore, it is an object of the present invention to provide a flip chip connecting process that enables the formation of solder, for connecting a semiconductor chip and a circuit board, into a configuration having an intermediate waist portion.

According to the invention, a flip chip connection process for a semiconductor chip, in which solder bumps formed on the semiconductor chip in a matrix arrangement are mated with solder bumps formed on a circuit board for flip chip connection. The process of the flip chip connection comprises the steps of:

forming a plurality of stud bumps on the semiconductor chip, on which a plurality of solder bumps are formed in the vicinity of the outer periphery thereof and out side of the solder bumps;

providing a cutting groove between a plurality of the solder bumps and the stud bumps;

mating the solder bumps on the semiconductor chip and the corresponding solder bumps on the circuit board and heating said bumps for integration of the mating solder bumps; and breaking a way the outer peripheral portion of the semiconductor chip along the cutting groove after flip chip connection in order to remove the stud bumps.

Preferably, the step of forming the stud bumps is performed by wire bonding a wire on each pad one time or a plurality of times in a repeated manner and by subsequently crushing the bonded wire to a desired height.

BRIEF DESCRIPTION OF THE DRAWINGS

The present invention will be understood more fully from the detailed description given herebelow and from the accompanying drawings of the preferred embodiment of the invention, which, however, should not be taken to be a limitation of the present invention, but are for explanation and understanding only.

In the drawings.

DESCRIPTION OF THE PREFERRED EMBODIMENTS

Each of the stud bumps is formed with a height higher than the height of the individual solder bumps but shorter than the total height of the mating solder bumps. In practice, the height of the stud bump is selected so as to form a smaller diameter waist portion form at the intermediate portion of integrated solder bumps.

The step of forming the stud bumps may be effected by wire bonding and cutting or tearing a wire at a predetermined cut length by a wire bonder and then crushing the predetermined cut length of wire into a length corresponding to the desired height of the stud bump and with a tip end plane surface. Also, it is possible that the wire bonding and cutting to a length shorter than the predetermined cut length, are sequentially repeated until the length of the cut wire attains the predetermined cut length.

As can be appreciated herefrom, according to the present invention, stud bumps of a desired height are provided on the outer periphery of the semiconductor chip for flip chip connection between the solder bumps on the semiconductor chip and the solder bumps on the circuit board. The stud bumps can be removed together with the peripheral portion of the semiconductor chip after completion of connection. By this method, the waist portion can be assuredly formed on the integrated solder to avoid concentration of stress at the junction between the solder and the substrates.

The stud bumps can be easily formed by a conventionally known wire bonding process using a gold (Au) or aluminum (Al) wire. The bonded wire is crushed or compressed to provide a stud bumps sufficient in height to integrate the solder bumps while maintaining smaller diameter waist portion at the intermediate position therebetween.

FIGS. 1A to 1E show the preferred embodiment of a flip chip connection method according to the present invention.

Initially, on a substrate surface of a semiconductor chip, on which an integrated circuit, such as LSI or so forth are formed, pads 4 for forming solder bumps 5 and stud bumps 9 thereon, are disposed by way of vacuum deposition of gold (Au) or other suitable material.

Ideally, the pads 4 for forming the stud bumps 9 are formed at four corners of the semiconductor chip 6. However, it is possible to arrange the pads 4 for forming the stud bumps in the vicinity of the peripheral edges in the form of an equilateral triangle.

Figure 1A:
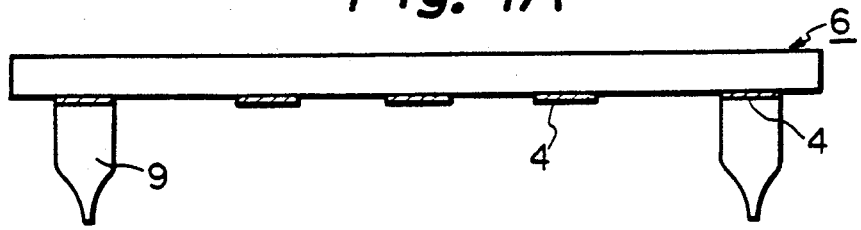
FIGS. 1A to 1E are sections showing process steps of a flip chip connection method according to the present invention.

On the pads 4 for the stud bumps, Au wires or aluminum (Al) wires are bonded by means of a wire bonder. Then, the bonded wire is cut or torn off by the wire bonder at a predetermined length (approximately 70 μm) appropriate for forming the stud bumps to form the stud bumps 9 (FIG. 1A).

Figure 1B:
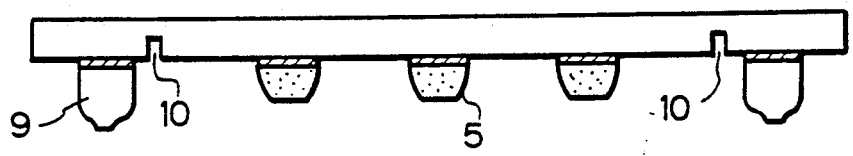
Figure 1C:
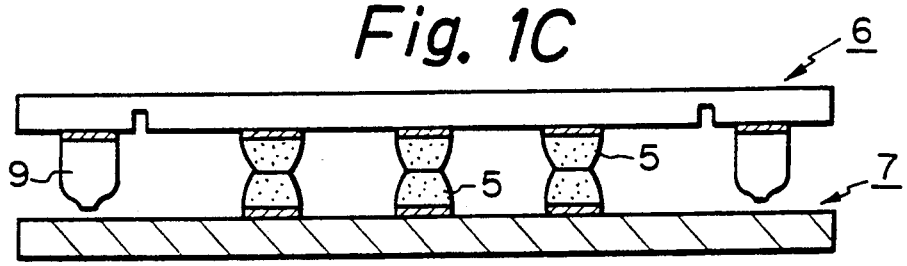

Then, by means of a dicing-saw, dicing lines 10 are formed to define the outer peripheral portion including the stud bumps 9. Also, in a manner similar to that of the prior art discussed with respect to FIG. 2, the solder bumps 5 are formed on the pads 4 inside of the dicing lines 10. At the same time, the stud bumps 9 are crushed into a predetermined height (FIG. 1B).

Thereafter, the solder bumps 5 on the semiconductor chip 6 are positioned in alignment with those on the circuit board 7 (FIG. 1C) substantially in the same manner as those in the prior art.

Figure 1D:
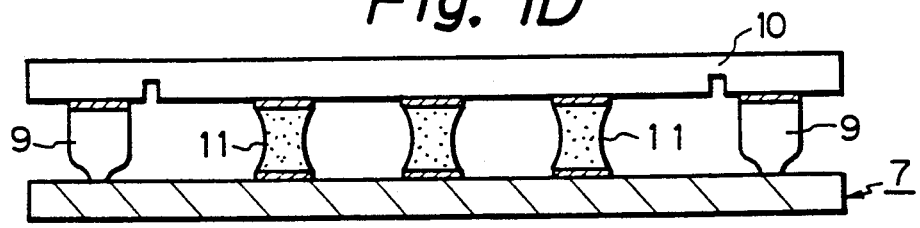
Figure 1E:
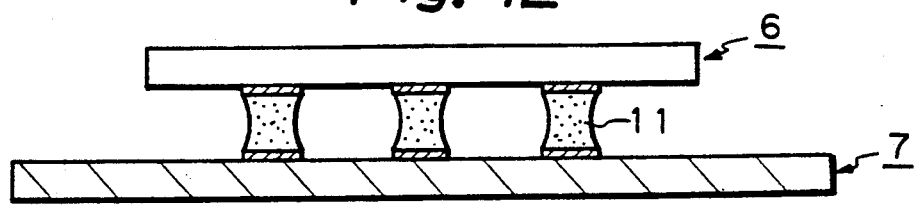
Figure 2A:
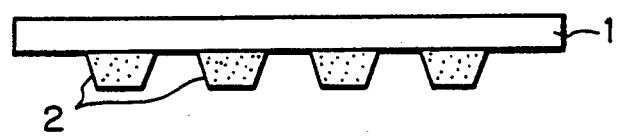
FIGS. 2A to 2E, as discussed above, are sections showing process steps in a conventional flip chip connection method.
Figure 2B:
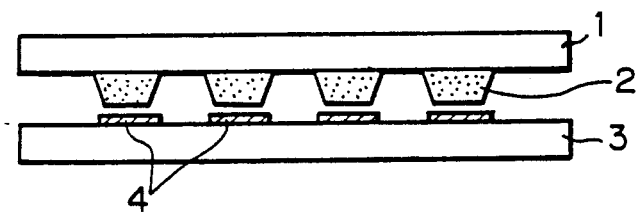
Figure 2C:
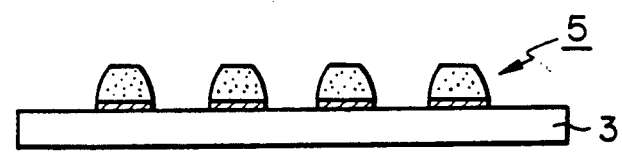
Figure 2D:
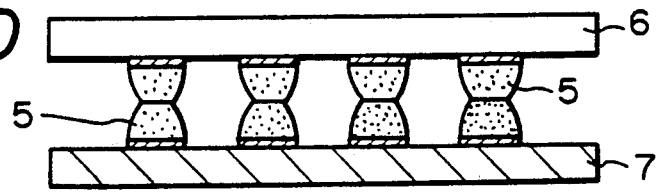
Figure 2E:
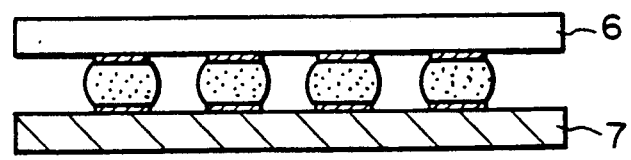

At this time, the stud bumps 9 having a predetermined height serve as spacers for maintaining a predetermined distance between the semiconductor chip 6 and circuit board 7 (FIG. 1D). The distance to be maintained between the semiconductor chip 6 and the circuit board 7 is selected so that the solder bumps of the semiconductor chip 6 and the circuit board 7 may form a configuration having a waist portion at the intermediate position.

Thereafter, the mating solder bumps 5 rendered molten by heating the circuit board 7 for welding. At time, since the stud bumps 9 maintain sufficient clearance between the semiconductor chip 6 and the circuit board 7 as set forth above, the welded solder cannot be crushed to the extent that it forms a cask shaped configuration but allows for a smaller diameter waist portion at the intermediate position thereof (FIG. 1D).

Thereafter, the semiconductor substrate is broken away at the dicing lines 10 so as to remove the outer circumferential portion together with the stud bumps 9.

By this method, a flip chip connection with the solder configuration having a smaller intermediate waist portion can be easily formed with satisfactory accuracy using a relatively simple method.

It should be appreciated that the size of the solder bumps is variable depending upon the size and rating of the semiconductor chip. Therefor, the height of the stud bumps is variable depending upon the size of the solder bumps.

In the case where a higher stud bump is required, since the height of the stud bump at one wire bonding operation after crushing is approximately 70 $\mu$m, the wire bonding process is repeated in order to obtain a desired height. The stud bump thus formed with the desired height is then crushed with an appropriate jig into the predetermined stud bump height.

The process of the present invention can provide advantages over the process as disclosed in the hereinbefore-mentioned Japanese Unexamined Patent Publication (Kokai) No. 4-22130, in that since the solder bumps on the semiconductor chip and on the circuit board are mated upon connection so as to be bonded with each other, good wettability between the bonded bumps is attained, and in addition, since the stud bumps are removed after completion of the flip chip connection, additional elements such as condensers or capacitors, resistors and the like can also be mounted.

According to one example utilizing the process of the present invention, a plurality of pads 4 were formed on the surface of a semiconductor chip formed of silicon (Si) and on the surface of a circuit board formed of ceramic or glass ceramic by vacuum deposition and photolithographic technology. Each pad 4 was formed into a circular configuration with an 80 $\mu$m diameter. The pads 4 were arranged in the matrix array with a center-to-center pitch of 150 $\mu$m.

In addition, on the four corners of the semiconductor chip, the pads 4 for the stud bumps were formed The pads 4 on the four corners were of the same diameter as those of the other pads.

The vacuum deposition layer forming each pad 4 had a three layer construction of Au/Pt/Ti from the lower side at the bottom layer of Ti. The thickness of the respective layers was 1000 Å.

Next, by means of a dicing saw, dicing lines 10 extending along the circumferential edge of the semiconductor chip were formed. The depth of the dicing line was 350 $\mu$m while the thickness of the semiconductor chip substrate was 500 $\mu$m.

On the pads 4 for the stud bumps on the four corners, Au wires with a 35 $\mu$m diameter were wire bonded The Au wires were then cut or torn at a height of 70 $\mu$m. The wire was then crushed to a height of 60 $\mu$m so as to have a plan tip end surface.

On the other hand, employing a conventional bump transfer method, solder bumps 5 with a height of 40 $\mu$m were formed on the semiconductor chip and the circuit board.

Then, flux was applied on the semiconductor chip surface and the circuit board surface. Thereafter, the semiconductor chip and the circuit board were mutually positioned and mated with respective corresponding solder bumps 5, and heated for soldering together. After connecting, a flux washing was performed. The circumferential portions of the semiconductor chip were broken away at the dicing lines 10, together with the stud bumps.

As a result, a 60 $\mu$m solder connection with a smaller diameter waist portion was obtained.

In another example utilizing the process of the present invention, a plurality of pads 4 were formed on the surface of a semiconductor chip formed of silicon (Si) and on the surface of a circuit board formed of glass ceramic by vacuum deposition and photolithographic technology. Each pad 4 was formed into a circular configuration with a 200 $\mu$m diameter. The pads 4 were arranged in a matrix array with a center-to-center pitch of 400 $\mu$m.

In addition, on the four corners of the semiconductor chip, pads 4 for the stud bumps were formed. The pads 4 on the four corners were of the same diameter as those of the other pads.

The vacuum deposition layer forming each pad 4 had a three layer construction of Au/Pt/Ti from the lower side at the bottom layer of Ti. The thickness of respective layers was 1000 Å.

Next, by means of a dicing saw, dicing lines 10 extending along the circumferential edge of the semiconductor chip were formed. The depth of the dicing line was 350 $\mu$m while the thickness of the semiconductor chip substrate was 500 $\mu$m.

On the pads 4 for the stud bumps on the four corners, Au wires with a 35 $\mu$m diameter were wire bonded. The Au wires were then cut at a height of 70 $\mu$m. This process was repeated sequentially five times. The resultant wire was then crushed to a height of 200 $\mu$m with a plane tip end surface.

On the other hand, employing a conventional bump transfer method, the solder bumps 5 with a 120 $\mu$m height were formed on the semiconductor chip and the circuit board.

Then, flux was applied on the semiconductor chip surface and the circuit board surface. Thereafter, the semiconductor chip and the circuit board were mutually positioned and mated with respective corresponding solder bumps 5, and heated for soldering together. After connecting, a flux washing was performed. The circumferential portions of the semiconductor chip were broken away at the dicing lines 10, together with the stud bumps.

As a result, the solder connection with a height of 200 $\mu$m and with a smaller diameter waist portion was obtained.

As can be appreciated, with the present invention, the solder connection with a solder configuration having an intermediate waist portion can be easily obtained through a relatively simple process. This contributes significantly to the improvement, in reliability, of the semiconductor device.

We claim:

1. A process for flip chip connection of a semiconductor chip, in which solder bumps formed on the semiconductor chip in a matrix, arrangement are mated with a solder bumps formed on corresponding circuit board for flip chip connection, the process of said flip chip connection comprising the steps of:

forming a plurality of stud bumps on the semiconductor chip, on which a plurality of solder bumps are formed in the vicinity of the outer periphery thereof and the outer side of said solder bumps;

providing a cutting groove between a plurality of said solder bumps and said stud bumps;

mating the solder bumps on said semiconductor chip and the corresponding solder bumps on said circuit board and heating for integration of the mating solder bumps; and breaking away the outer peripheral portion of said semiconductor chip along said cutting groove after a flip chip connection in order to remove said stud bumps.

2. A process as set forth in claim 1, wherein said step of forming said stud bumps is performed by wire bonding a wire on a pad one time or a plurality of times in a repeated manner and by subsequently crushing the bonded wire to a desired height.

3. A process as set forth in claim 1, wherein each of said stud bumps is formed with a height higher than the height of the individual solder bumps but shorter than the total height of the mating solder bumps.

4. A process as set forth in claim 3, wherein the height of each of said stud bumps is selected so as to form a smaller diameter waist portion at an intermediate portion of the integrated solder bumps.

5. A flip chip connection method as set forth in claim 1, wherein said step of forming each said stud bump is performed by wire bonding and cutting a wire to a predetermined cut length and then crushing said predetermined cut length of wire into a length corresponding to the desired height of said stud bump and forming a tip end plane surface.

6. A process as set forth in claim 5, wherein the step of wire bonding and cutting is performed by initially cutting the wire to a length shorter than said predetermined cut length, and sequentially repeating the step until the length of the cut wire attains said predetermined cut length.

* * * * *